(12) United States Patent
Fu et al.

(10) Patent No.: US 7,969,251 B2
(45) Date of Patent: Jun. 28, 2011

(54) FRACTIONAL DIVIDER

(75) Inventors: Zhuo Fu, San Diego, CA (US); Susumu Hara, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 12/821,893

(22) Filed: Jun. 23, 2010

(65) Prior Publication Data

US 2010/0259333 A1 Oct. 14, 2010

Related U.S. Application Data

(62) Division of application No. 11/763,060, filed on Jun. 14, 2007, now Pat. No. 7,764,134.

(51) Int. Cl.
*H03B 19/00* (2006.01)

(52) U.S. Cl. ............... 331/74; 331/1 A; 331/16; 331/44; 331/176; 327/117; 327/156

(58) Field of Classification Search ................... 331/1 A, 331/14–18, 23–25, 44, 66, 74, 176; 327/156–159, 327/115–118
See application file for complete search history.

(56) References Cited

U.S. PATENT DOCUMENTS

| | | | |
|---|---|---|---|
| 5,777,524 A | 7/1998 | Wojewoda et al. | |
| 5,986,512 A * | 11/1999 | Eriksson | ........................ 331/16 |
| 6,236,703 B1 * | 5/2001 | Riley | ........................ 377/48 |
| 6,351,485 B1 | 2/2002 | Soe et al. | |
| 6,563,448 B1 * | 5/2003 | Fontaine | ........................ 341/143 |
| 6,703,901 B2 | 3/2004 | Jovenin et al. | |
| 6,972,635 B2 | 12/2005 | McCorquodale et al. | |
| 7,042,258 B2 | 5/2006 | Booth et al. | |
| 7,050,525 B2 * | 5/2006 | Adachi et al. | ................. 375/376 |
| 7,068,110 B2 * | 6/2006 | Frey et al. | ........................ 331/17 |
| 7,181,180 B1 | 2/2007 | Teo et al. | |
| 7,271,666 B1 * | 9/2007 | Melanson | ........................ 331/16 |
| 7,345,549 B2 | 3/2008 | Xu | |
| 7,417,510 B2 | 8/2008 | Huang | |
| 2004/0232995 A1 | 11/2004 | Thomsen et al. | |
| 2004/0247027 A1 | 12/2004 | Wang | |
| 2006/0139102 A1 | 6/2006 | Tucholski | |

(Continued)

FOREIGN PATENT DOCUMENTS

EP 0683558 A1 11/1995

(Continued)

OTHER PUBLICATIONS

Allen, Daniel J. and Carley, Adam L., "Free-Running Ring Frequency Synthesizer," 2006 IEEE International Solid-State Circuits Conference, Feb. 7, 2006, pp. 380-381.

(Continued)

*Primary Examiner* — James H. Cho
*Assistant Examiner* — Christopher Lo
(74) *Attorney, Agent, or Firm* — Zagorin O'Brien Graham LLP

(57) ABSTRACT

A divider control circuit includes a first and a second delta sigma modulator configured to generate a divider control signal for a fractional-N divider and a fractional signal indicative of a phase error in the divider output. The fractional signal is supplied for control of an interpolator circuit. The divider control circuit may be implemented as a look-ahead circuit where two or more divider control signals and fractional signals are generated during a single cycle to allow the divider control circuit to be run at a reduced clock rate.

14 Claims, 8 Drawing Sheets

U.S. PATENT DOCUMENTS

2008/0315963 A1    12/2008    Huang

FOREIGN PATENT DOCUMENTS

WO    2004088846 A1    10/2004

OTHER PUBLICATIONS

Dai, Fa Foster et al., "A Direct Digital Frequency Synthesizer with Fourth-Order Phase Domain .DELTA..SIGMA. Noise Shaper and 12-bit Current-Steering DAC," IEEE Journal of Solid-State Circuits, vol. 41, No. 4, Apr. 2006, pp. 839-850.

Meninger, Scott E. and Perrott, Michael H., "A 1-MHZ Bandwidth 3.6GHz 0.18-.mu.m CMOS Fractional-N Synthesizer Utilizing a Hybrid PFD/DAC Structure for Reduced Broadband Phase Noise," IEEE Journal of Solid-State Circuits, vol. 41, No. 4, Apr. 2006, pp. 966-980.

Yang, Chin-Yuan et al., "A High-Frequency Phase-Compensation Fractional-N Frequency Synthesizer," IEEE International Symposium on Circuits and Systems, 2005 ISCAS, May 23-26, 2005, pp. 5091-5094.

Analog Devices, ADF4157 "High Resolution 6 GHz Fractional-N Frequency Synthesizer," 2007-2008, 24 pages.

Heng, Chun-Huat and Song, Bang-Sup, "A 1.8-GHz CMOS Fractional-N Frequency Synthesizer with Randomized Multiphase VCO," IEEE Journal of Solid-State Circuits, vol. 38, No. 6, Jun. 2003, 7 pages.

Miletic, Igor and Mason, Ralph, "Bandwidth Expansion in Sigma-Delta PLLs Using Multiphase VCOs," IEEE Canadian Conference on Electrical and Computer Engineering, CCECE, May 2006, pp. 971-974.

* cited by examiner

_US 7,969,251 B2_

FRACTIONAL DIVIDER

CROSS-REFERENCE TO RELATED APPLICATION(S)

This application is a division of U.S. application Ser. No. 11/763,060 filed Jun. 14, 2007, entitled "Fractional Divider" naming inventors Zhuo Fu and Susumu Hara, which application is incorporated entirely herein by reference.

BACKGROUND

1. Field of the Invention

This invention relates to dividers used in electronics circuits and more particularly to dividers where the divisor includes an integer and a fractional component.

2. Description of the Related Art

Dividers are utilized in a wide variety of electronic circuits. Dividers that have fractional divides are used in applications such as clock synthesizers that generate clock signals utilized by a wide variety of electronic products. A typical synthesizer utilizes a phase-locked loop (PLL) supplied with a reference signal from a source such as a crystal oscillator. The output frequency of the signal supplied by the synthesizer can be determined by a divider value of the feedback divider in the PLL. Thus, a reference frequency supplied to the PLL is "multiplied" based on the divider value to generate the synthesized clock frequency.

Several types of divider circuits have been utilized in PLLs. One kind of divider is the integer-N divider in which the input signal is divided by an integer number. For example, FIG. 1A illustrates the timing diagram of several integer divides including a divide by two, a divide by three and a divide by four. The signal being divided is CLKin. Note that no jitter is introduced in the frequency division process, other than noise from circuit non-idealities. FIG. 1B illustrates the simple integer divide by 2 provided by a D flip-flop (DFF) 151.

Another type of PLL architecture uses a fractional-N divider. FIG. 1C illustrates a timing diagram of fractional-N frequency division. Fractional-N frequency division allows use of a non-integer divisor by changing the integer divide value according to the fractional portion of the divisor. That is, a stream of integer divides are performed that approximate the desired ratio. For example, FIG. 1C illustrates a timing diagram of a divide by 2.25. The input clock (CLKin) is shown as waveform 101 having a period of one unit interval (UI). The output of the fractional-N divider is shown in waveform 103. As shown in waveform 103, the divide by 2.25 is achieved by a sequence of divide by 2 for three periods and a divide by 3 for one period, assuming a first order delta sigma modulator is used to control the fractional-N divider. Waveform 105 illustrates the ideal waveform for a divide by 2.25. The quantization noise of the modulator, at the output of the fractional-N divider is shown as the difference at 107, 109, and 111, between the actual output of the fractional-N divider shown in waveform 103 and the ideal output for a divide by 2.25 shown in waveform 105.

One technique for supplying control signals to a fractional-N divider is to use a delta-sigma modulator to supply a divide sequence to the fractional-N feedback divider. The fractional-N divider receives a divide value sequence corresponding to a desired divider value. The fractional-N divider supplies the divided signal to a phase detector with noise associated with the nature of the fractional-N divider. In fractional-N clock synthesis, the fractional-N noise may be filtered out by the PLL loop. In addition, phase error correction may be utilized to address the jitter introduced by the divider by introducing an offset into the PLL corresponding to the jitter generated by the fractional-N divider.

However, the clock synthesizers described above may have limited frequency coverage (integer dividers) and/or require a complex loop filter and complex VCO control that increase the cost in design effort and chip area, resulting in more expensive products that may be too expensive in cost or real estate for significant portions of the clock synthesizer market.

Thus, it would be desirable to provide a low-cost, flexible, clock synthesizer solution. One aspect of such a solution would be a divider that can meet desired speed and power considerations.

SUMMARY

Accordingly, in one embodiment an apparatus coupled to receive an input signal and supply as an output signal the input signal divided by a number having an integer portion and a fractional portion (M/N), where M and N are integers and M<N. The apparatus includes a divider that generates a divider output signal according to a divider control signal. A division control circuit includes a first and a second delta sigma modulator configured to generate the divider control signal and a fractional signal, the fractional signal corresponding to accumulation of the fractional portion (M/N) and indicative of a phase error in the divider output. The fractional signal is for coupling to an interpolator circuit. In an embodiment, the second delta sigma modulator is configured to generate as the fractional signal a quantized fractional signal corresponding to the fractional signal quantized to L levels of a period of the input signal, where L is an integer.

In another embodiment a look-ahead apparatus is utilized. In one such embodiment, an apparatus receives an input signal and supplies as an output signal the input signal divided by a number having an integer portion and a fractional portion (M/N), where M and N are integers and M<N. The apparatus includes a fractional-N divider that generates an output according to a divider control signal. A first circuit includes a first delta sigma modulator configured to supply, during a clock cycle of the first and a second circuit, a first divider control signal to the fractional-N divider as the divider control signal and to supply a first fractional signal to a phase interpolator circuit, the first fractional signal corresponding to an error in the output signal of the fractional-N divider that corresponds to the first divider control signal. The apparatus further includes the second circuit that includes a second delta sigma modulator configured to supply, during the clock cycle of the first and second circuit, a second divider control signal to the fractional-N divider as the divider control signal and to supply a second fractional signal to a phase interpolator circuit, the second fractional signal corresponding to an error in the output signal of the fractional-N divider that corresponds to the second divide control signal.

In another embodiment a method is provided for generating control signals for controlling a divide operation that divides an input signal by a number having an integer portion and a fractional portion (M/N), where M and N are integers and M<N. The method includes generating in a divider circuit an output signal according to a divider control signal. The method further includes generating, using a first and a second delta sigma modulator, the divider control signal and a fractional signal indicative of a phase error in the output signal. The fractional signal is supplied to an interpolator circuit.

A method of generating in a divider control circuit control signals for dividing an input signal by a number having an integer portion and a fractional portion (M/N), where M and N are integers and M<N, and generating an output signal. The method includes generating during one period of a clock signal being supplied to clock the divider control circuit a first and second divider control signal indicating an integer by which to divide the input signal in a fractional-N divider and a first and second fractional signal indicative of a phase error respectively associated with a fractional-N divider output signal generated when the input signal is divided by the first and second integer control signals during first and second successive clock periods of the output signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1A:
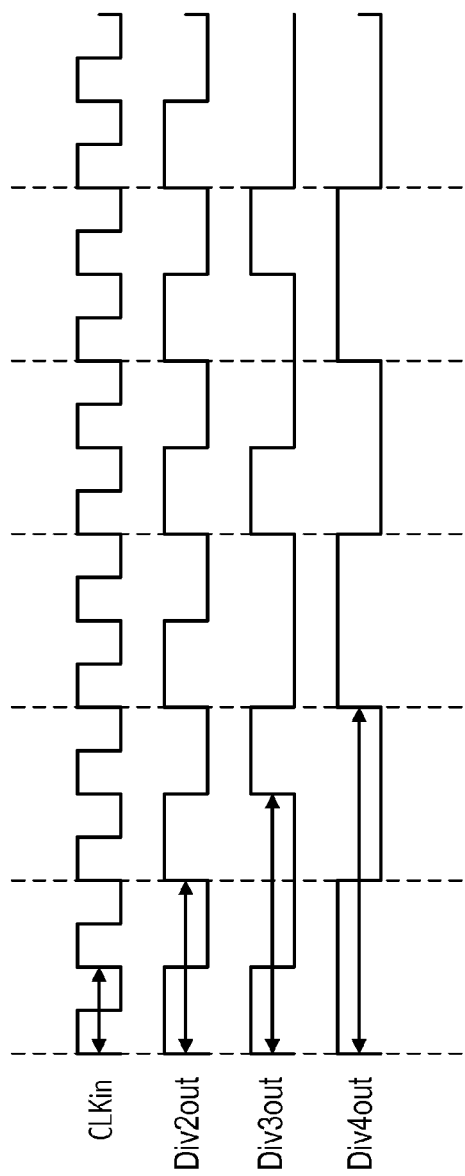
FIG. 1A illustrates integer frequency division.
Figure 1B:
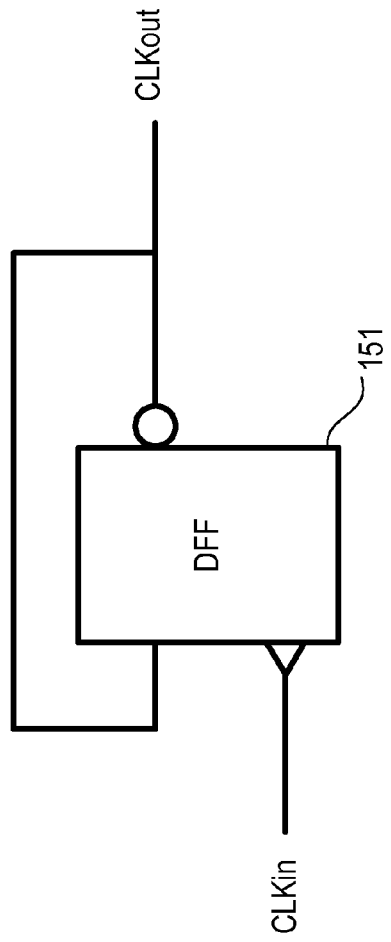
FIG. 1B illustrates a circuit providing a simple divide circuit to provide a divide by two division.
Figure 1C:
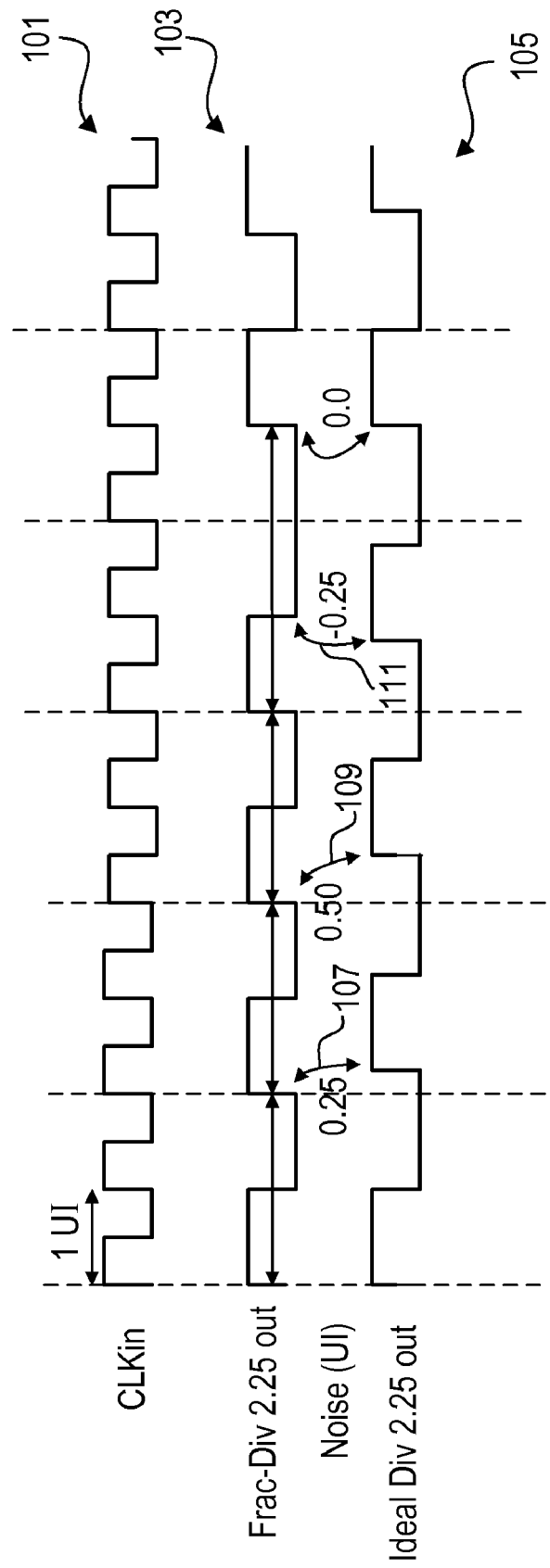
FIG. 1C illustrates a timing diagram of an exemplary fractional-N frequency division operation.
Figure 2A:
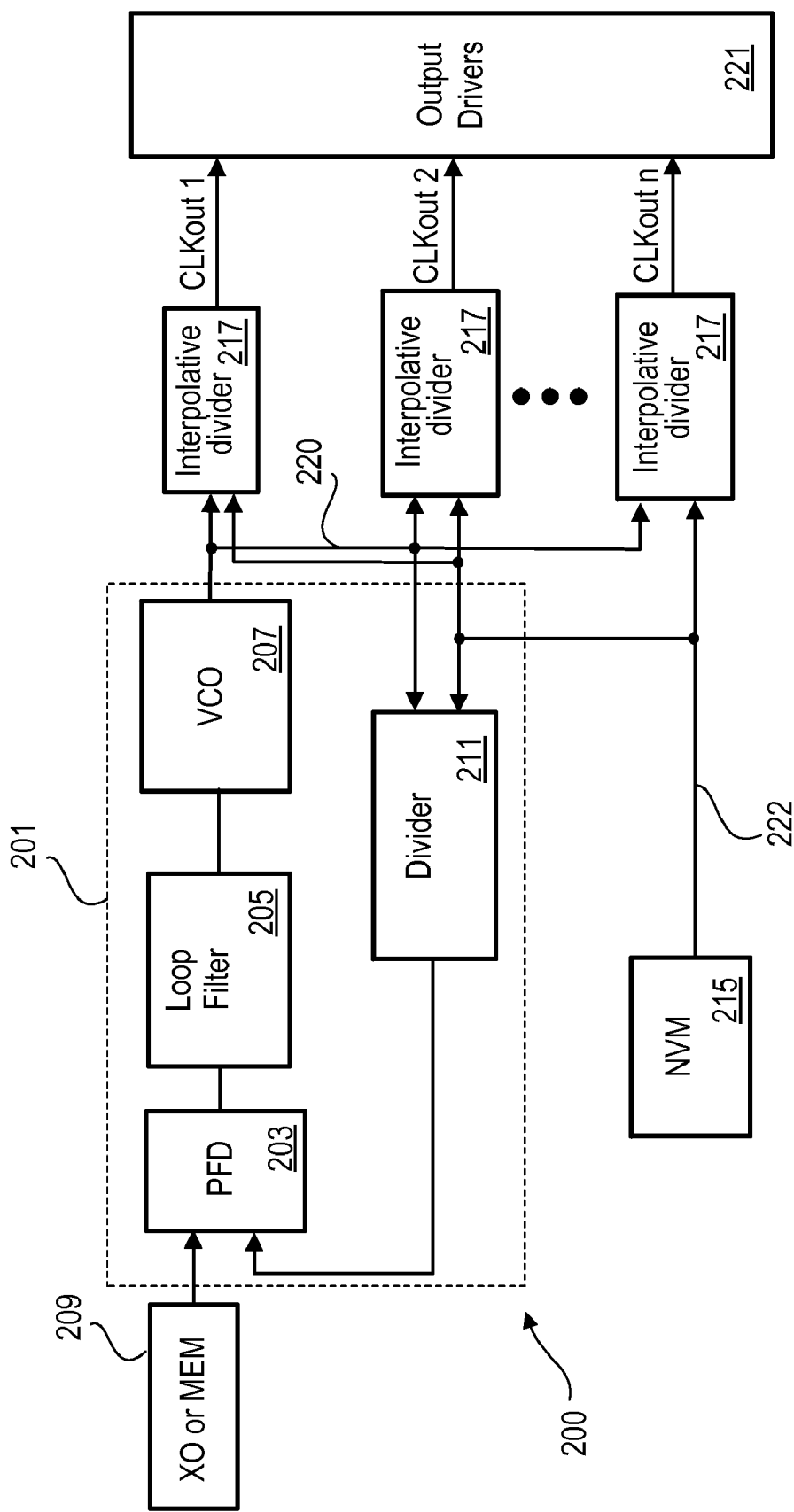
FIG. 2A illustrates an embodiment of an interpolative clock synthesizer incorporating multiple interpolative dividers to generate multiple independent outputs, which may utilize one or more embodiments of the invention.

Embodiments of the present invention may be utilized in a variety of divider applications. One such application is illustrated in FIG. 2A illustrating an exemplary architecture of an interpolative clock synthesizer 200. The architecture includes a PLL 201 that includes a phase/frequency detector (PFD) 203, a loop filter 205, and a voltage controlled oscillator (VCO) 207. The loop filter may be implemented as a digital loop filter to avoid the necessity of off-chip capacitors. The VCO may be implemented as a ring oscillator or as an LC oscillator. Other oscillator structures may also be utilized. The PFD 203 receives a reference clock signal, which can come from a fixed source 209 such as a crystal oscillator or micro electro mechanical structure (MEMS) oscillator.

The PLL 201 also includes a divider 211. A non-volatile memory 215 supplies a divide ratio to the divider 211. In addition, the one or more interpolative dividers 217 are provided that receive the VCO output signal 220. Note that divider 211 may also be implemented as an interpolative divider. For flexibility, an integer divider may also be provided. The dividers 217 (and the integer divider if utilized) supply the output drivers 221. The interpolative dividers 217 receive divide ratios 222 from the NVM 215.

Figure 2B:
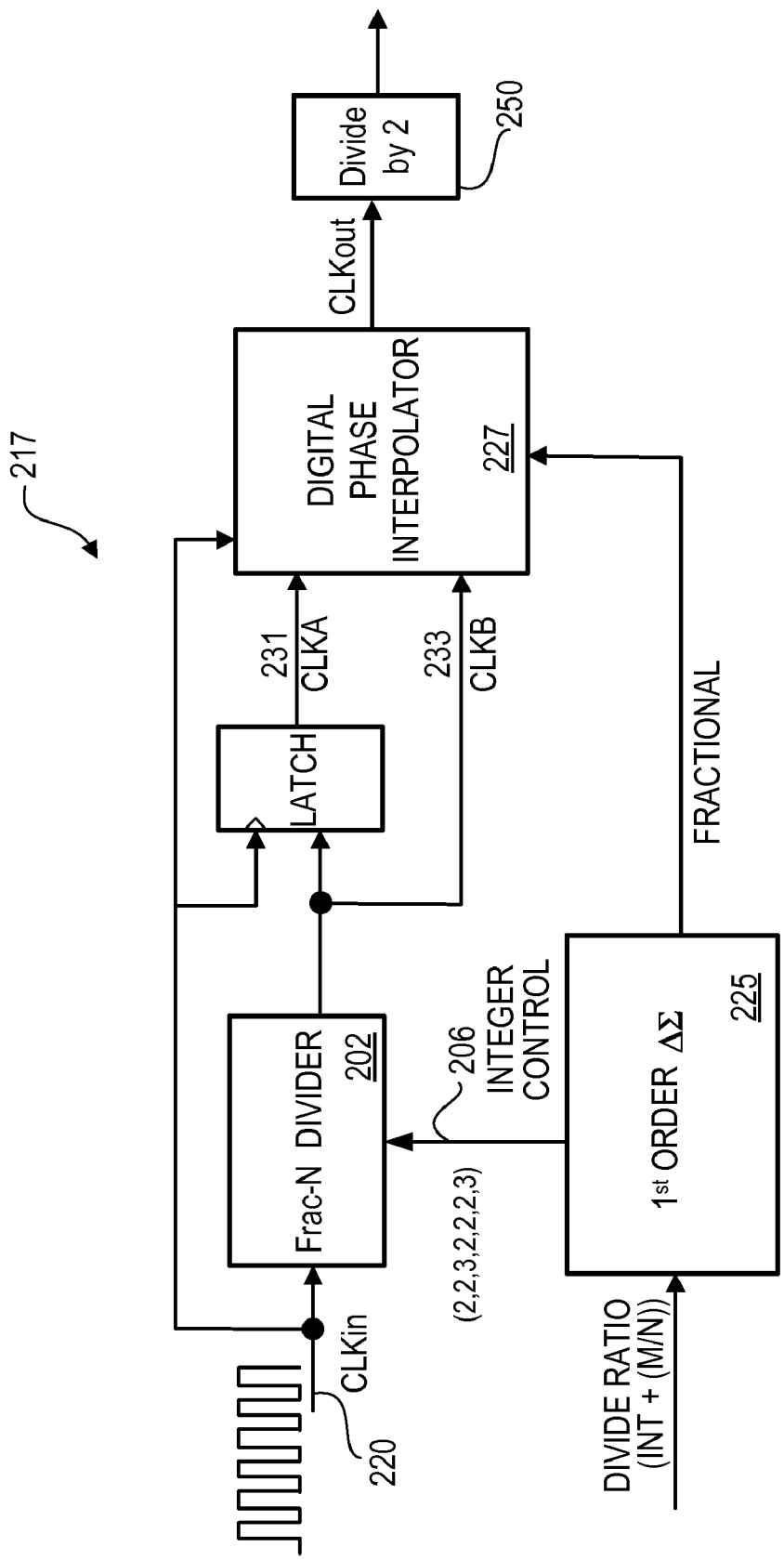
FIG. 2B illustrates an embodiment of an interpolative divider that may utilize one or more embodiments of the invention.

Referring to FIG. 2B, an exemplary interpolative divider 217 is illustrated. The divider includes a fractional-N divider 202 providing multi-modulus dividing capability, which receives the VCO clock 220. A first order delta sigma modulator 225 receives the divide ratio that includes an integer portion (INT) and a fractional portion (M/N) where M and N are integers and M<N. Note that the divide ratio may be received with the integer portion incorporated into the fraction, i.e., M>N. The divide ratio may be stored by the non-volatile memory or other memory location. For example, a programming interface on the integrated circuit may provide the divide ratio to a programmable register. The fractional-N divider 202 receives divide control signal 206, which is a stream of integer divide values to approximate the actual divide ratio. For example, as shown in FIG. 2B, for a divide by 2⅓, the divider 202 receives a sequence of (2, 2, 3, 2, 2, 3). The digital quantization error, corresponding to the fractional portion of the divide ratio, is supplied to the digitally controlled phase interpolator 227. The jitter introduced by the fractional-N divider 202 is canceled by interpolation between CLKA 231 and CLKB 233 in phase interpolator 227 based on the digital quantization error supplied by the delta sigma modulator 225. Thus, the VCO clock 220 is divided down by the divider 202 according to the control information provided by the delta sigma modulator 225. The phase interpolator 227 is used to cancel the quantization errors in the output of the fractional-N divider 202. Additional information on clock synthesis using phase interpolation can be found in patent application Ser. No. 11/550,223, filed Oct. 17, 2006 (now U.S. Pat. No. 7,417,510, issued Aug. 26, 2008) naming Yunteng Huang as an inventor, and entitled "Direct Digital Interpretive Synthesis," which application is incorporated by reference herein.

Figure 3:
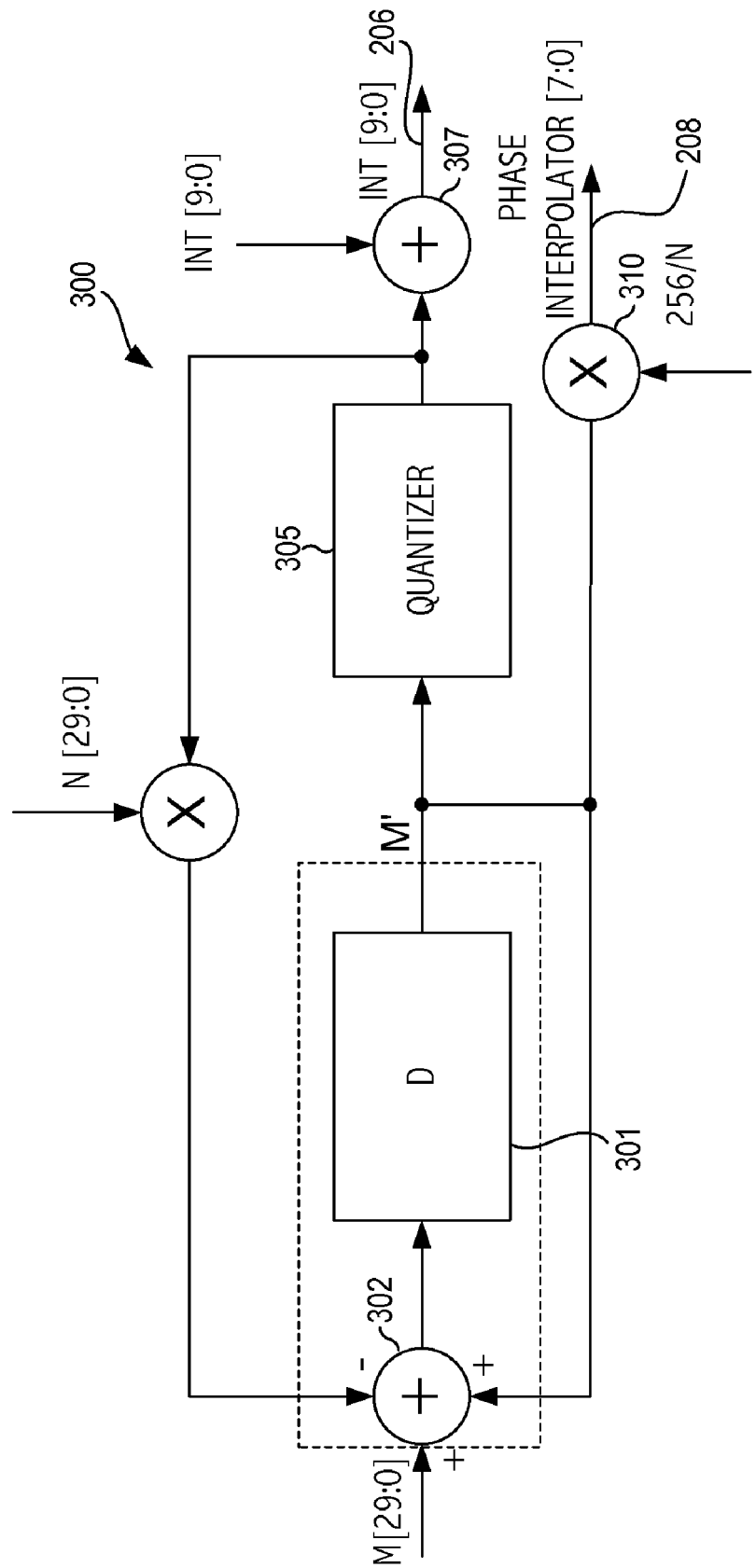
FIG. 3 illustrates a high level diagram of an embodiment of a delta sigma modulator that may be utilized in the circuit of FIG. 1.

Referring to FIG. 3, one approach to generating the appropriate integer divide control signal and the digital quantization error signal, corresponding to the fractional portion of the divide ratio, is shown. Conceptually, the input clock frequency is being divided by (Int+M/N) where Int, M, and N are integers and M<N. Assume that the fractional portion of the divide ratio is M/N and for this example, both are 30 bit numbers [29:0]. The appropriate clock phase is computed by accumulating the fractional period of the input clock using the delta sigma modulator 300. The accumulator includes storage element (D) 301 and summer 302. The quantizer (Q) 305 generates $Q_{OUT}=1$ when Qin>=N, else $Q_{OUT}=0$. The summing circuit 302 subtracts N, whenever $Q_{OUT}=1$. Summing circuit 307 increases the divider control signal 206 by one whenever the accumulated phase error is greater than a period of the input clock. Thus, for a divide by 2⅓, the sequence for integer control signal 206 is (2, 2, 3, 2, 2, 3). In order for the phase interpolator to properly interpolate to adjust the clock signal generated by divider 202, the phase error supplied on control line 208 to the phase interpolator is quantized, e.g., to 256 levels of a period of the input clock, i.e., mod((M'/N)×256, 256), where M' is the output of the accumulator, and where mod is modulo operator. In the example shown in FIG. 2, the input clock is 2.5 GHz, so each level represents approximately 1.56 picoseconds.

In FIG. 3, the quantization value is generated in multiplier 310. Alternatively, the quantization can be thought of as divide, i.e., the accumulated value of M times 256 divided by N. That multiplication (or division) operation is expensive in silicon area and should be performed every output clock cycle, or edge, according to the particular embodiment, in order to properly adjust the clock signal generated by the integer division. Having to quantize the phase error every clock cycle to 256 levels of the input clock period means the operation is also expensive in terms of power consumption.

Figure 4:
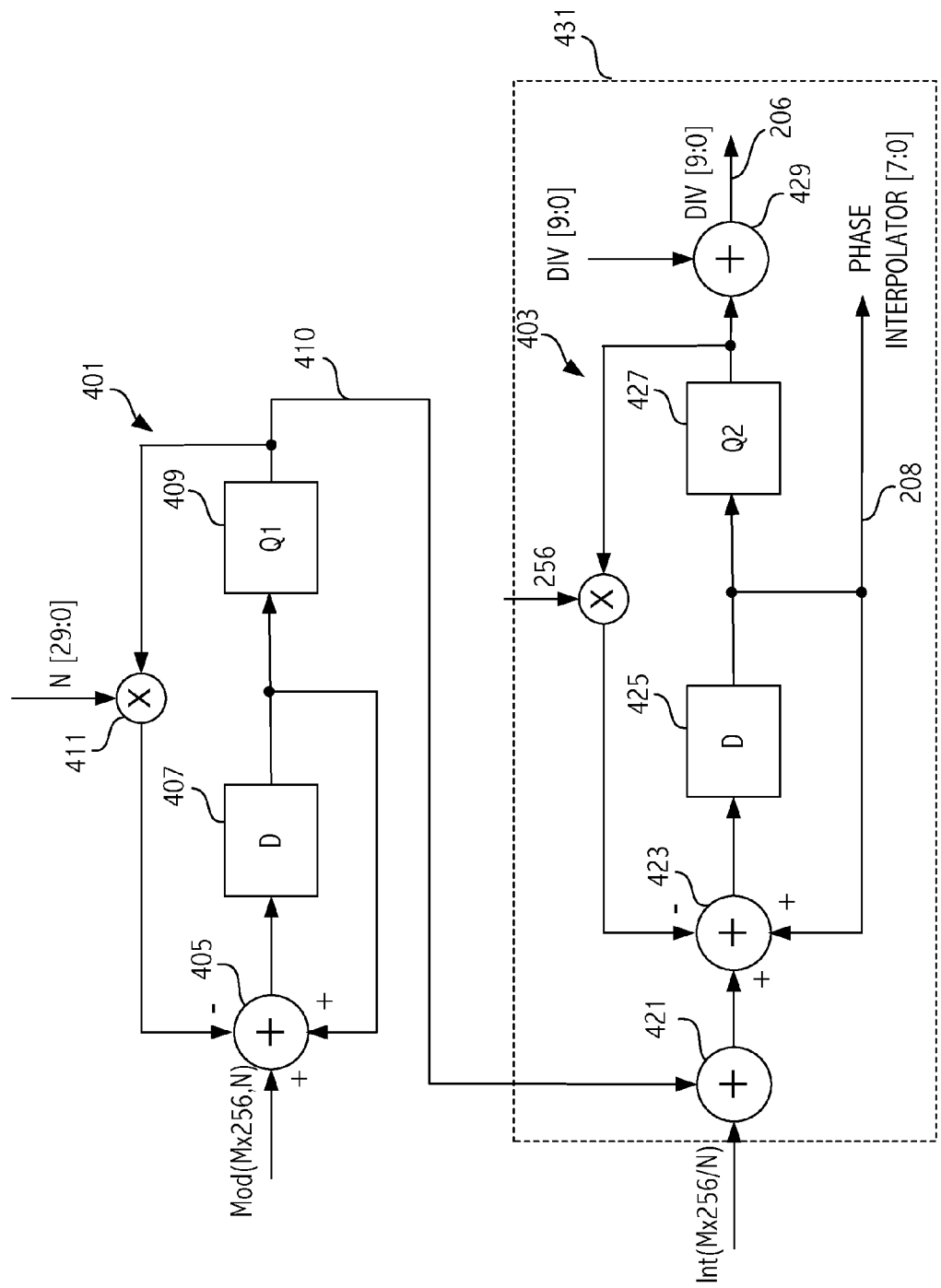
FIG. 4 illustrates an embodiment in which two first order delta sigma modulators are used to generate the fractional-N divider control signal and the phase interpolator control signal.

An alternative approach to the quantization of the phase error for use by the phase interpolator is shown in FIG. 4. The alternative approach reduces the cost of the quantization of the fractional phase error to 256 levels by eliminating the division and multiplication operations. Instead, two delta sigma modulators 401 and 403 are used. An error is associated with the quantization of the phase error to 256 levels. The first DSM 401 accumulates that quantization error. The second DSM 403 accumulates the quantized phase error, i.e., the quantized fractional portion of the divisor. DSM 401 receives Mod(M×256, N). For example, assume the divisor is 5⅔ (M=2 and N=3). Mod(M×256,N)=2. Thus, the accumulator, utilizing summing circuit 405 and storage element 407 accumulates the fractional portion of the quantization error associated with quantization of the phase error. The operation of the quantizer (Q1) 409 is defined as: Qin>=0, Qout=1; else, Qout=0. Of course a different number of quantization levels other than 256 may be utilized according to the specific needs of the system.

The second DSM 403 supplies the quantized fractional portion of the divisor on 208 as the phase interpolation value and determines when the integer control value supplied on 206 should be increased by one. Assuming that the divisor is 5⅔, summing circuit 421 receives the integer value of Int(M× 256/N). Assuming a phase increment M/N=⅔, and quantization of the phase increment to 256 levels, summing circuit 421 receives a phase increment of 170. The phase increment is the fractional portion of the divisor that accumulates. Summing circuit 421 also sums the quantization error term from delta sigma modulator (DSM) 401 supplied on signal line 410. Summing circuit 421 supplies its sum to summing circuit 423. Summing circuit 423 adds the accumulated quantization term fed back from memory element 425 and subtracts 256 whenever the quantization value supplied by quantizer Q2 equals 1. Quantizer Q2 427 operates as follows: if Qin >=256, then Qout=1; else, Qout=0. When the accumulated value is >=256, and Q2 outputs a 1, the integer control value 206 is increment by one in summer 429 and a value of 256 is fed back to summer 423 to be subtracted from the accumulated value. Note that the integer divide control value is either integer (e.g., 5 when the divisor is 5⅓) or (integer+1). Note that the proportion of (integer+1) to integer being supplied as the integer divide control value is M/N.

In the embodiment shown in FIG. 4, the lower eight bits of the accumulated value is sent as the fractional part of the divisor for use by the phase interpolator on signal line 208. That is, if the accumulator value is greater than 256, only the fractional part is sent to the interpolator. Note that a reference to a signal line herein may be to a single or plural physical lines depending on the context.

The embodiment illustrated in FIG. 4 saves power and silicon area by eliminating the need for the multiplier 310 and the multiply (or divide) operation for every clock edge of the output clock. However, the error accumulation in the embodiment shown in FIG. 4 is still expensive, with 30 bit adders, and may fail to meet timing requirements when the output clock is at a high frequency. Note that the DSM blocks shown in FIG. 4 may be run at twice the frequency of the divided signal in order to obtain the phase information for both clock edges. That allows the output clock to have good phase noise on each transition or edge. In an embodiment that is accomplished by dividing by half of the desired rate in the fractional N divider and following that fractional-N divider with a divide by 2 after phase correction in the phase interpolator.

For example, in an embodiment, assume it is desired to divide by 5⅓. In that case the first order delta sigma modulator 225 in FIG. 2B receives a divide value of 2⅔. The output clock generated by the fractional-N divider and after phase correction by the phase interpolator is thus initially twice the frequency of the desired output clock. However, one edge (e.g., each rising edge) of that output clock has been phase corrected and that output clock is then supplied to a divide by 2 circuit 250 (see FIG. 2B). The edge with good phase information (e.g., the rising edge of the divide by 2⅔) is then used to define an output clock from the divide by two that is divided by 5⅔ from the original input clock and has the correct phase information at each edge. Other embodiments may have correct phase information at only one edge.

One way to reduce the power consumption for the embodiment shown in FIG. 4 is to run the error accumulation at a decimated clock rate. That is the DSM 401 can be run at a decimated clock rate while DSM 403 is run at the regular rate. The trade off for running the error accumulation at a decimated clock rate is that the peak to peak noise level will be increased and the spectrum of the phase noise spur is denser. Assuming decimation of the clock by $2^n$, the worse case peak to peak noise level increases by $((2^n-1)/256) \times T_{CLKIN}$, where $T_{CLKIN}$ is the period of the input clock to the divider, e.g., the VCO clock. The extra phase noise can be reduced by assuming finer quantization levels in the calculation. By adding n bits for the quantization level for $2^n$ decimation, the extra peak to peak phase noise is bounded by $(1/256) \times T_{CLKIN}$. Thus, e.g., if you decimate by 2 (n=1), then the phase interpolator receives nine bits instead of eight. If the frequency of the VCO ($F_{VCO}$)=2.5 GHz, the phase noise is bounded by 1.56 picoseconds.

Figure 5:
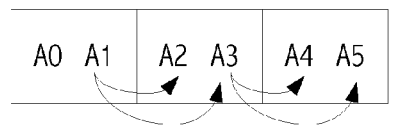
FIG. 5 illustrates conceptually a look-ahead technique according to an embodiment of the invention.

In order to preserve the noise performance associated with the embodiment shown in FIG. 4, but without decimating clock and still meet timing requirements at high output clock frequencies such as 350 MHz, a look-ahead technique can be utilized. FIG. 5 illustrates conceptually the idea of generating two values for every clock cycle. Since all the values are known, the two values can be computed at the same time. For example, as shown in FIG. 5, two values A0, A1 can be computed in one clock cycle. A1 is then be used to compute two values A2 and A3 during the next cycle. A3 is then used to compute A4 and A5 during the third cycle and so on. Note that A0 through A5 terms in FIG. 5 represent generation of two of each of the error terms associated with the quantization of the fractional portion of the divisor, the phase interpolator control signal (the quantized fractional portion of the divisor), and the integer divider control signal.

Figure 6:
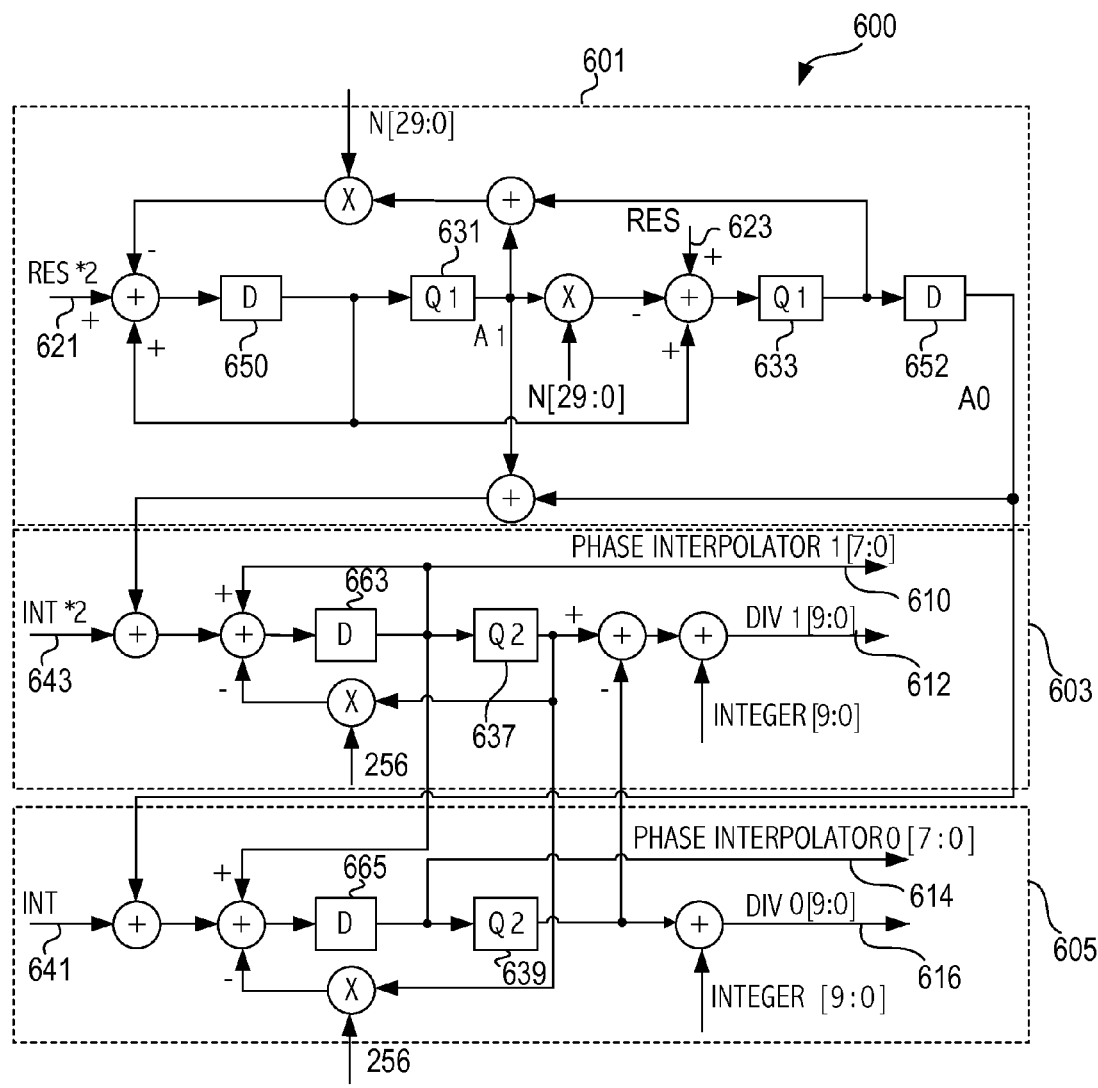
FIG. 6 illustrates an embodiment implementing the look-ahead technique of FIG. 5.

FIG. 6 illustrates an embodiment of the look-ahead technique illustrated in FIG. 5. The circuits shown in FIG. 6 run at half the clock rate required for the implementation of the embodiment shown in FIG. 4 (without decimation). For each clock cycle of the circuit shown in FIG. 6, two consecutive integer control signals are determined and two consecutive phase errors (accumulated fractional portion of the divisor) are computed.

FIG. 6 shows in more detail one embodiment of a look-ahead circuit in which the look-ahead circuit may be clocked at half the rate of the clock required in FIG. 4. In an embodiment in which each clock edge is adjusted, the clock rate of the look-ahead circuit is half the clock rate of the output clock from the fractional-N divider circuit. In that embodiment, the phase corrected output clock is subsequently divided by 2 to achieve the desired division. The error generation circuit 601 generates two error terms A0 and A1 associated with the quantization of the fractional portion of the divisor for two successive cycles of the output clock from the fractional-N divider. Block 603 generates the phase interpolator control signal 610 (the fractional part of the accumulated quantized fractional portion of the divisor), and the divider control signal 612 for the second output clock cycle that occurs in the look-ahead circuit's clock cycle. Block 605 generates the phase interpolator control signal 614 (the fractional part of the accumulated quantized fractional portion of the divisor), and the divider control signal 616 for the first output clock cycle that occurs in the look-ahead circuit's clock cycle. Two consecutive clock phases are computed each cycle by the look-ahead circuit. In the look-ahead circuit 600, Residue (Res) is defined as: mod(M*256, N). For example, for a divisor of 5⅔, Res=2. Res is supplied on 623 and (Res×2) is supplied on 621. (Res×2) represents the accumulated quantized error term for two cycles. For example, for a divisor of 5⅔, Res×2=4. The INT term supplied on 641 is the integer portion of the quantized fractional portion of the divisor and is defined as: Int(M*256/N). If the fractional portion of the divisor equals ⅓, the INT term is 85 (assuming a quantization to 256 levels). INT×2 supplied on 643 represents two output clock cycles worth of the quantized fractional portion. Note that circuit portions 603 and 605 operate in a manner similar to the circuit portion 431 shown in FIG. 4. For the quantizers Q1 631 and 633, the operation of the quantizers is defined as: if Qin>=0, Qout=1; else, Qout=0. For the quantizers Q2 637 and 639, the operation of the quantizers is defined as: if Qin >=512, Qout=2; else if Qin>=256, Qout=1; else, Qout=0.

The following example explains operation of the error generation circuit 601. Assume the divisor is 5⅓. RES*2=2; RES=1; N=3, INTEGER=5, INT=85, INT*2=170. Assuming the storage elements 650 and 652 are initially zero, for the first cycle: quantizer Q1(631)=1; inputs to quantizer Q1(633) =RES+output(650)–output(631)*3=1+0–3=–2; therefore, quantizer Q1(633)=0; the inputs to storage element 650=RES*2+output(650)–(output(631)+output(633))*3=2+ 0–3=–1; therefore, after the first cycle A0=0, A1=1.

For the second clock cycle: output(650)=–1, output (652) =0, Q1(631)=0, input to Q1(633)=1+(–1)=0; therefore, the quantizer output Q1(633)=1; input to 650=2+(–1)–3=–2; therefore, A0=0, A1=0;

For the third clock cycle: output (650)=–2, output (652)=1, Q1(631)=0, input to Q1(633)=1+(–2)=–1; Q1(633)=0, input to 650=2+(–2)=0; A0=1, A1=0. The next clock cycle repeats the first clock cycle.

Looking at circuit blocks 603 and 605: for the first cycle: D(665)=0, Q2(639)=0, input to D(665)=A0+INT+D(663)– Q2(637)*256=0+85+0–0=85. D(663)=0, Q2(637)=0, input to D(663)=A0+A1+INT*2+D(663)–Q2(637)*256=1+170+ 0–0=171. Therefore, DIV0=5, PHASEINTERP0=0, DIV1=5, PHASEINTERP1=0.

For the next cycle: D(665)=85, Q2(639)=0, input to D(665) =0+85+171–0=256. D(663)=171, Q2(637)=0, input to D(663)=0+170+171–0=341; therefore, DIV0=5, PHASEINTERP0=85, DIV1=5, PHASEINTERP1=171.

For the next cycle: D(665)=256, Q2(639)=1, input to D(665)=1+85+341–256=171; D(663)=341, Q2(637)=1, input to D(663)=1+170+341–256=256. Therefore, DIV0=6, PHASEINTERP0=0, DIV1=5, PHASEINTERP1=85.

| | DIV | PHASE INTERP |
|---|---|---|
| Clock edge 0 | 5 | 0 |
| Clock edge 1 | 5 | 0 |
| Clock edge 2 | 5 | 85 |
| Clock edge 3 | 5 | 171 |
| Clock edge 4 | 6 | 0 |
| Clock edge 5 | 5 | 85 |

The table above shows the overall control sent to divider and the phase interpolator on successive clocks. The control signals sent have a pattern that repeats every three clock edges. That is, the pattern at clock 5 starts to repeat the pattern beginning at clock 2.

Figure 7:
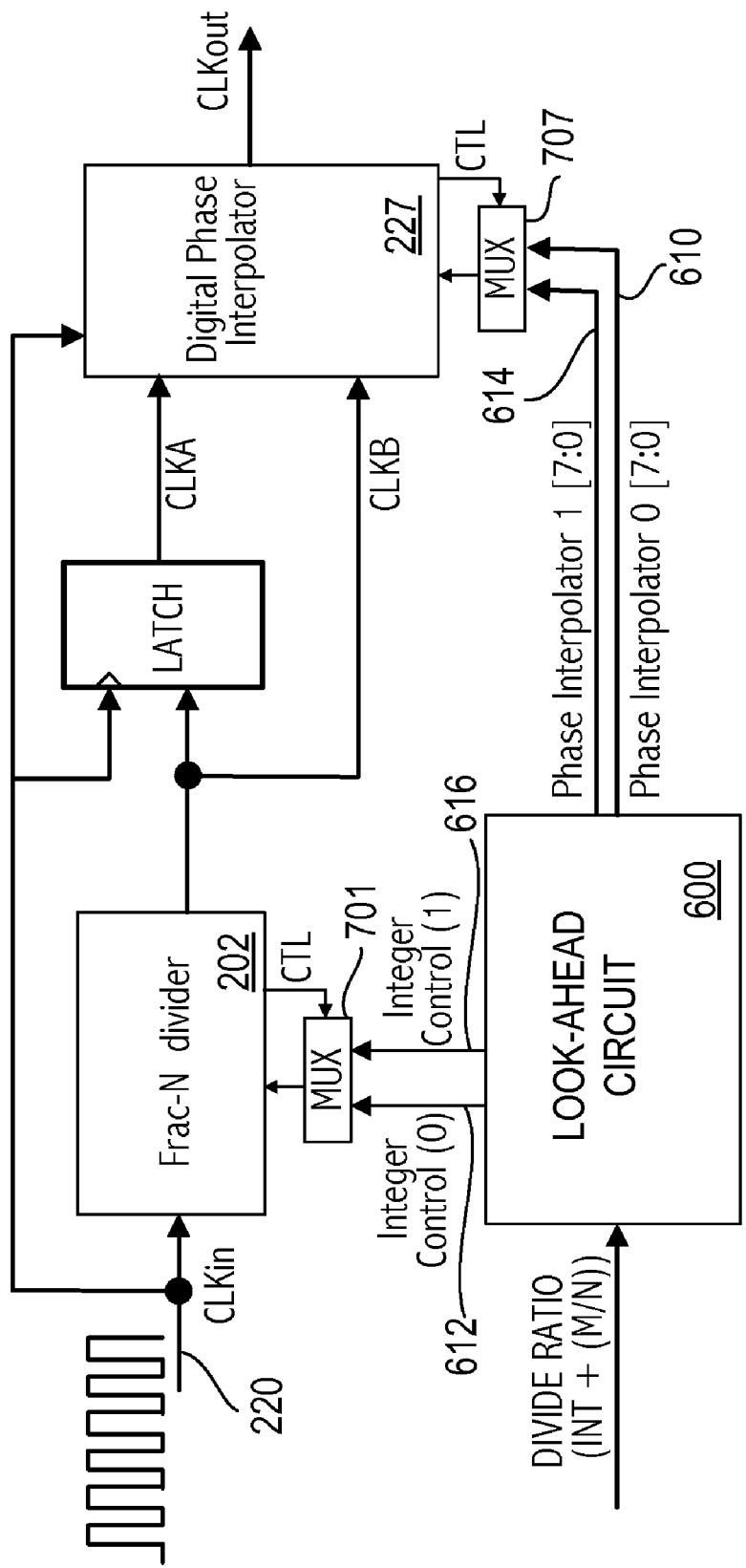
FIG. 7 illustrates how the look-ahead circuit is utilized in an interpolative divider circuit.

Referring to FIG. 7, the look-ahead circuit 600 supplies two integer control signals 612 and 616 to the divider 202 and two fractional signals 610 and 614 to the phase interpolator 227. A select circuit 701 controlled by the divider circuit 202 selects the appropriate divider control signal. Similarly, a select circuit 707 controlled by the digital phase interpolator selects the appropriate phase interpolator signal. Note that multiplexers 701 and 707 can be included in the look-ahead circuit 600 but the select signals need to be sufficiently fast to switch the divider and phase interpolator signals at the appropriate time.

Note that the look-ahead circuit shown in FIG. 6 looks ahead one cycle (generates two values for each cycle). In other embodiments, the look-ahead circuit may generate more look-ahead values than two, e.g., four values may be generated (look-ahead 3 output clock cycles). That would save more power but cost more area.

The description of the invention set forth herein is illustrative, and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. An apparatus coupled to receive an input signal and supply as an output a divided signal corresponding to the input signal divided by a number having an integer portion and a fractional portion (M/N), where M and N are integers and M <N, the apparatus comprising:
    a fractional-N divider generating an output signal according to a divider control signal;
    a first circuit including a first delta sigma modulator configured to supply, during a clock cycle of the first and a second circuit, a first divider control signal to the fractional-N divider as the divider control signal and a first fractional signal to a phase interpolator circuit, the first fractional signal corresponding to an error in the output signal of the fractional-N divider that corresponds to the first divider control signal; and
    the second circuit including a second delta sigma modulator configured to supply, during the clock cycle of the first and second circuit, a second divider control signal to the fractional-N divider as the divider control signal and a second fractional signal to the phase interpolator circuit, the second fractional signal corresponding to an error in the output signal of the fractional-N divider that corresponds to the second divider control signal.

2. The apparatus as recited in claim 1 wherein the first divider control signal and the first fractional signal are for use with a first cycle of the output signal and the second divider control signal and the second fractional signal are for use during an immediately following second cycle of the output signal.

3. The apparatus as recited in claim 1 further comprising a divider control signal selector circuit selecting one of the first and second divider control signals for use by the fractional-N divider during a particular cycle of the output signal.

4. The apparatus as recited in claim 1 further comprising an interpolator selector circuit selecting one of the first and second fractional signals during a particular cycle of the output signal for use by the phase interpolator circuit.

5. The apparatus as recited in claim 1 wherein the first and second circuits operate at half of a frequency of the output signal of the fractional-N divider.

6. A method of generating in a divider control circuit control signals for dividing an input signal by a number having an integer portion and a fractional portion (M/N), where M and N are integers and M<N, and generating a divided signal, the method comprising:
  generating during one period of a clock signal being supplied to clock the divider control circuit a first and a second integer divider control signal indicating respective integers by which to divide the input signal in a fractional-N divider and generating during the one period of the clock signal a first and a second fractional signal indicative of respective phase errors respectively associated with respective output signals of the fractional-N divider generated when the input signal is divided by the first and second integer divider control signals during respective first and second consecutive periods of the output signal.

7. The method as recited in claim 6,
  generating in a first circuit including a first delta sigma modulator the first divide control signal and the first fractional signal; and
  generating in a second circuit including a second delta sigma modulator the second divide control signal and the second fractional signal.

8. The method as recited in claim 6 further comprising:
  receiving at a divider control signal selector circuit the first and second divider control signals;
  selecting in the divider control signal selector circuit the first divider control signal for use by the fractional-N divider during the first period of the output signal; and
  selecting the second divider control signals for use by the fractional-N divider during the second period of the output signal.

9. The method as recited in claim 6 further comprising selecting in an interpolator selector circuit one of the first and second fractional signals during the first period of the output signal for use by an interpolator circuit and selecting another of the first and second fractional signals for use by the interpolator circuit during the second period of the output signal.

10. The method as recited in claim 9 further comprising adjusting respective outputs of the fractional-N divider in the interpolator circuit according to respective ones of the first and second fractional signals supplied to the interpolator circuit to generate the divided signal.

11. The method as recited in claim 6 further comprising operating the first and second circuit at a slower clock rate than a frequency of the output signal from the fractional-N divider.

12. A method of generating in a divider control circuit control signals for dividing an input signal by a number having an integer portion and a fractional portion (M/N), where M and N are integers and M<N, and generating a divided signal, the method comprising:
  generating, during one period of a clock signal being supplied to clock the divider control circuit, a plurality of divider control signals indicating respective integers by which to divide the input signal in a fractional-N divider, and generating during the one period of the clock signal a plurality of fractional signals indicative of phase errors respectively associated with respective output signals of the fractional-N divider generated when the input signal is divided by respective ones of the plurality of divider control signals during respective consecutive periods of the output signal.

13. The method as recited in claim 12 further comprising:
  adjusting respective outputs of the fractional-N divider in an interpolator circuit according to respective ones of the fractional signals to generate the divided signal.

14. The method as recited in claim 12 further comprising operating the divider control circuit at a slower clock rate than a frequency of the output signal from the fractional-N divider.

* * * * *